United States Patent [19]
Taylor, Jr. et al.

[11] Patent Number: 6,001,532
[45] Date of Patent: *Dec. 14, 1999

[54] PEEL-APART PHOTOSENSITIVE ELEMENTS AND THEIR PROCESS OF USE

[75] Inventors: Harvey Walter Taylor, Jr., Sayre; Gregory Charles Weed, Towanda, both of Pa.

[73] Assignee: E.I. Dupont de Nemours and Company, Wilmington, Del.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/936,905

[22] Filed: Sep. 25, 1997

[51] Int. Cl.$^6$ .............................. G03C 1/805; G03C 11/12
[52] U.S. Cl. ........................... 430/258; 430/260; 430/262; 430/263
[58] Field of Search .................................. 430/258, 260, 430/262, 263

[56] References Cited

U.S. PATENT DOCUMENTS

| | | | |
|---|---|---|---|
| 3,469,982 | 9/1969 | Celeste | 430/278.1 |
| 3,649,268 | 3/1972 | Chu et al. | 96/27 R |
| 3,984,244 | 10/1976 | Collier et al. | 427/359 |
| 4,053,313 | 10/1977 | Fan | 96/36 |
| 4,174,216 | 11/1979 | Cohen et al. | 430/257 |
| 4,258,247 | 3/1981 | Shimada et al. | 219/137 |
| 4,282,308 | 8/1981 | Cohen et al. | 430/271 |
| 4,304,839 | 12/1981 | Cohen et al. | 430/253 |
| 4,316,951 | 2/1982 | Cohen et al. | 430/253 |
| 4,489,153 | 12/1984 | Ashcraft et al. | 430/253 |
| 4,719,169 | 1/1988 | Platzer et al. | 430/258 |
| 4,902,504 | 2/1990 | Wilson et al. | 424/84 |
| 4,999,266 | 3/1991 | Platzer et al. | 430/14 |
| 5,001,036 | 3/1991 | Choi | 430/271 |
| 5,019,536 | 5/1991 | Taylor, Jr. | 428/220 |
| 5,028,511 | 7/1991 | Choi | 430/293 |
| 5,071,731 | 12/1991 | Chen et al. | 430/271 |
| 5,087,549 | 2/1992 | Peiffer | 430/253 |
| 5,234,790 | 8/1993 | Lang et al. | 430/253 |
| 5,609,984 | 3/1997 | Hou | 430/256 |
| 5,667,935 | 9/1997 | Hou | 430/256 |
| B1 4,053,313 | 11/1987 | Fan | 430/270 |

FOREIGN PATENT DOCUMENTS

| | | |
|---|---|---|
| 0 260 873 | 3/1988 | European Pat. Off. . |
| 0 386 355 | 9/1990 | European Pat. Off. . |
| 0 664 485 A2 | 7/1995 | European Pat. Off. .......... G03F 3/10 |
| 0 816 921 A1 | 1/1998 | European Pat. Off. .......... G03F 3/10 |
| 1 366 769 | 3/1972 | United Kingdom . |
| WO 92/15920 | 9/1992 | WIPO . |

OTHER PUBLICATIONS

U.S. Patent application Ser. No. 08/937,825 filed Sep. 25, 1997.

*Primary Examiner*—John S. Chu
*Assistant Examiner*—Yvette M. Clarke

[57] ABSTRACT

A peel-apart photosensitive element comprising in order: a strippable cover sheet; a photosensitive layer; an essentially non-photosensitive, non-tacky organic layer comprised of block or random polymers of at least one aromatic polymer and at least one non-aromatic monomer; and a support, wherein the photosensitive layer has a lowered peel force in relation to the cover sheet after exposure to actinic radiation.

14 Claims, No Drawings

PEEL-APART PHOTOSENSITIVE ELEMENTS AND THEIR PROCESS OF USE

FIELD OF THE INVENTION

This invention relates to a photosensitive element and more particularly, this invention relates to a low peel force peel-apart, photosensitive element and its process of use.

BACKGROUND OF THE INVENTION

Photosensitive elements which can be used in image-reproduction processes are well-known in the graphics arts industry. Such elements are exposed to actinic radiation through an image-bearing transparency, such as a color separation transparency, and developed to produce an image which is either positive or negative with respect to the transparency used. Positive-working elements produce an image which is a duplicate of the transparency through which they are exposed. Negative-working elements produce an image that is the reverse of the transparency through which they are exposed. After imagewise exposure, the photosensitive elements may be developed by washout of soluble image areas, toning tacky image areas with a colorant, peeling apart photoadherent layers, or combinations of these techniques. A series of images may be combined to form a color proof. A useful reference for color proofing methods is *Principles of Color Proofing*, by Michael H. Bruno, GAMA Communications, Salem,. N.H., 1986.

In Cohen and Fan, U.S. Pat. No. 4,282,308, there is described a photosensitive element which is capable of producing reverse, colored images by a dry process without the need for toning with a colorant. The element comprises, in order from top to bottom, a strippable cover sheet, a photoadherent layer containing a colorant, a tacky essentially nonphotosensitive elastomeric layer, and a support. After imagewise exposure to actinic radiation through the cover sheet, the element can be peeled apart by peeling off the cover sheet with the exposed areas of the colored photoadherent layer adherent thereto. The unexposed areas of the colored photoadherent layer remain on the supported elastomeric layer. When the imagewise exposure is through a negative transparency, and the exposed element is peeled apart, a positive image is obtained on the peeled-off cover sheet and a negative image is obtained on the supported elastomeric layer. Imagewise exposure through a positive transparency, followed by peeling apart of the element, yields a negative image on the peeled-off cover sheet and a positive image on the supported elastomeric layer. However, these tacky, essentially nonphotosensitive elastomeric layer containing elements result in high peel force peel-apart systems.

A need exists for a photosensitive element comprised of layers which have a low peel force and the required adhesion balance so the element can be effectively developed using peel-apart development.

SUMMARY OF THE INVENTION

In accordance with the present invention improved multilayer peel-apart photosensitive elements are provided which comprise, in order, from top to bottom:

(1) a strippable cover sheet which is transparent to actinic radiation;

(2) a photosensitive layer, optionally containing a colorant;

(3) an essentially non-photosensitive, non-tacky (at room temperature) organic layer comprising a polymer selected from the group consisting of:

(a) structured, preferably block, or random polymers prepared from at least one aromatic monomer and at least one monomer selected from the group consisting of butadiene, olefin such as ethylene, propylene, etc., butylene, isobutylene, butene, isoprene, 1,4-hexadiene, acrylonitrile and vinyl acetal; and (b) reaction products of random polymers prepared from at least one aromatic monomer and at least one monomer selected from the group consisting of an olefins such as ethylene, propylene, etc., and butylene with 2-butenedioic acid or cyclic anhydrides; and (4) a support sheet.

A photorelease layer consisting essentially of a solid oxyethylene homopolymer photorelease agent of the formula, $H(COH_2CH_2)_nOH$, with a molecular weight greater than about 3000 between a strippable cover sheet and the photosensitive layer may also be present to effect image reversal when used with the proposed elements. These peel-apart elements result in low peel force peel-apart systems.

DETAILED DESCRIPTION OF THE INVENTION

The present invention is directed to an element comprising, in order: a strippable cover sheet which is transparent to actinic radiation; a photosensitive layer, optionally containing a colorant; an essentially non-photosensitive, non-tacky organic layer comprising a polymer selected from the group consisting of:

(a) block or random polymers prepared from at least one aromatic monomer and at least one monomer selected from the group consisting of butadiene, olefin such as ethylene, propylene, etc., butylene, isobutylene, butene, isoprene, 1,4-hexadiene, acrylonitrile and vinyl acetal; and (b) reaction products of random polymers prepared from at least one aromatic monomer and at least one monomer selected from the group consisting of an olefins such as ethylene, propylene, etc., and butylene with 2-butenedioic acid or cyclic anhydrides.

STRIPPABLE COVER SHEET

The cover sheet of the element of the invention must be strippable (i.e., removable by peeling the element apart) from the rest of the element, carrying with it only the exposed areas of the photosensitive layer. The cover sheet is preferably oxygen impermeable and transparent to actinic radiation so that the element may be exposed through the cover sheet. Preferred materials for the cover sheet are polymeric films, particularly polyester films such as polyethylene terephthalate and polyethylene naphthalate. Polyamide, polyimide, polystyrene or polyolefin, e.g., polyethylene or polypropylene films may also be employed. In order to make the exposed areas of the photosensitive layer adhere better to the cover sheet, the cover sheet surface may be modified; for example, the topography may be altered and the polarity increased by a surface treatment such as electrostatic discharge, flame treatment, plasma or electron beam treatment. Suitable such treatments are disclosed in U.S. Pat. No. 4,282,308, the disclosure of which is incorporated herein by reference.

While the thickness of the cover sheet may be varied over a wide range, films having a thickness of 0.002 inch (50 microns) or less are particularly preferred. The cover sheet should be thick enough to withstand treatments to it. The cover sheet may additionally comprise auxiliary layers to improve adhesion, strength, and other properties.

PHOTOSENSITIVE LAYER

The photosensitive layer is one in which the adhesive relationship vis-a-vis the cover sheet and the essentially non-photosensitive, non-tacky organic layer is altered by exposure to actinic radiation. Before exposure to actinic radiation, the photosensitive layer adheres more strongly to the essentially non-photosensitive, non-tacky organic layer than to the cover sheet. If the unexposed element were peeled apart by peeling off the cover sheet, the photosensitive layer would remain with the essentially non-photosensitive, non-tacky organic layer. This is because the peel force between the cover sheet and the photosensitive layer before exposure is very low (less than 10 g/in). However, the exposed areas of the photosensitive layer adhere more strongly to the cover sheet than to the essentially non-photosensitive, non-tacky organic layer and would be removed with the cover sheet if it were peeled off at the appropriate peel rate. Nevertheless, the peel force required to remove the cover sheet along with the exposed areas of the photosensitive layer is considerably less than current systems where no organic layer as described herein is present.

Optionally, the photosensitive layer is pigmented. The pigmented photosensitive layer is preferably photopolymerizable, comprising an ethylenically unsaturated photopolymerizable monomer, a polymeric binder and an initiator or initiator system which initiates free radical addition polymerization on exposure to actinic radiation. The colorant may be a water insoluble colorant such as a pigment or a disperse, or a water soluble dye.

Some suitable monomers, binders, initiators or initiating systems and colorants are disclosed in Assignee's U.S. Pat. Nos. 5,001,036, 4,282,308 and 4,489,153, the disclosures of which are incorporated herein by reference.

Other additives may be present in the photosensitive layer as long as they are compatible with the other ingredients present in the photosensitive layer and they do not alter the adhesion balance between the essentially non-photosensitive, non-tacky organic layer and the support sheet. Such additives include stabilizers, antihalation agents, optical brightening agents, release agents, surfactants coating aids and plasticizers. A thermal polymerization inhibitor may also be present to increase storage stability of the photosensitive element. Some useful additives are disclosed in U.S. Pat. Nos. 5,001,036, 4,282,308 and 4,489,153, the disclosures of which are incorporated herein by reference.

In general, the photosensitive layer should have a coating weight in the range of 5–50 mg/dm$^2$, preferably 20 to 35 mg/dm$^2$.

ESSENTIALLY NON-PHOTOSENSITIVE, NON-TACKY ORGANIC LAYER

The essentially non-photosensitive, non-tacky organic layer comprises a polymer selected from the group consisting of:

(a) structured, preferably block or random polymers prepared from at least one aromatic monomer such as styrene, substituted styrenes such as α-methyl styrene, p-hydroxy styrene, etc. and at least one monomer selected from the group consisting of butadiene, olefins such as ethylene, propylene, etc., butylene, isobutylene, butene, isoprene, 1,4-hexadiene, acrylonitrile and vinyl acetal. Some useful structured, preferably block and random polymers include styrene//ethylene/butylene//styrene block copolymer, styrene//ethylene/propylene block copolymers, hydrogenated butadiene or isoprene polymers with styrene, styrene//butadiene//ethylene block copolymers, ethylene-1,4-hexadiene/propylene rubber that has grafted to it isobutylene and styrene or isobutylene and α-methyl styrene, styrene/ethylene/isobutylene random copolymers, polystyrene graft copolymers such as styrene//acrylonitrile, styrene//isobutylene, styrene//ethylene or styrene//propylene, polyolefin polymers with styrene grafted thereon, and acrylonitrile/ethylene/isobutene/styrene/vinyl acetate, acrylonitrile/ethylene/propylene/styrene/vinyl acetate, acrylonitrile/1-butene/ethylene/propylene/vinyl acetate, acrylonitrile/ethylene/isobutene/styrene and acrylonitrile/ethylene/olefin/styrene. Triblocks are derived from the diblocks using a linking agent. In the polymers disclosed above "//" represent blocks and random is represented by a "/".

(b) reaction products of random polymers prepared from at least one aromatic monomer and at least one monomer selected from the group consisting of an olefins such as ethylene, propylene, etc., and butylene with 2-butenedioic acid or cyclic anhydrides; and By "non-tacky" we mean that the layer is substantially non-tacky at room temperature.

The coating weight of the essentially non-photosensitive, non-tacky organic layer may be varied over a wide range, but generally a coating weight of about 25 to 200 mg/dm$^2$, preferably about 60 to 150 mg/dm$^2$, and more preferably about 70 to 95 mg/dm$^2$ will be satisfactory. The layer may be coated as a dispersion, e.g., an aqueous dispersion, with satifactory results.

SUPPORT SHEET

The support sheet may be any film that has the necessary characteristics for the proper adhesion to the essentially non-photosensitive, non-tacky organic layer. Some suitable materials for support would include untreated, silicone-treated, electrically discharged, corona-treated, electron beam treated or plasma-treated polyester, matte finished polyester or polyethylene, etc. Support sheets are commercially available as Mylar® polyester film, available from E. I. du Pont de Nemours and Company, Wilmington, Del. (DuPont) and Melinex® from ICI.

PHOTORELEASE LAYER

To form a reverse or positive working overlay, the photorelease layer may optionally be present between the strippable cover sheet and the photosensitive layer. it comprises a solid oxyethylene homopolymer photorelease agent of the formula, $H(COH_2CH_2)_nOH$, with a molecular weight greater than about 3000. A suitable polymer would be POLYOX® WSR-N-3000 (Manufactured by Union Carbide Chemicals and Plastics Co., Inc.).

The homopolymer may be used in combination with UV stabilizers, anti-oxidants, etc. Some useful UV stabilizers include benzotriazoles and benzophenones. Some useful anti-oxidants include hindered phenols such as tetrakis [methylene 3-(3,5-di-t-butyl-4-hydroxyphenyl)propionate] methane, and 1,3,5-trimethyl-2,4,6-tris(3,5-di-t-butyl-4-hydroxybenzyl)benzene.

Some useful photorelease layers are disclosed in U.S. Pat. Nos. 5,028,511 and 5,001,036, the disclosures of which are incorporated herein by reference.

PROCESS OF MANUFACTURE

The element of the invention is prepared by applying, preferably coating, the photorelease layer and the photosensitive layer on the cover sheet. Any method and apparatus known to one skilled in the art may be used in applying these layers. For example, the cover sheet may be coated with the photorelease layer and the photosensitive layer by roller coating, spray coating, gravure coating, slot coating, or extrusion coating, preferably extrusion coating. The essentially non-photosensitive, non-tacky organic layer may be applied to the support sheet and the so prepared elements laminated together with the photosensitive layer adjacent the essentially non-photosensitive, non-tacky organic layer. Any other means known to those skilled in the art may be used to prepare the element of the invention.

Preferably, the photosensitive layer is coated on the cover sheet. Alternately, the photosensitive layer may be coated on the dried surface of the essentially non-photosensitive, non-tacky organic layer and cover sheet may be laminated to it. It is important that the essentially non-photosensitive, non-tacky, organic layer have greater adhesion to the photosensitive layer than to the support sheet.

PROCESS OF USE

The invention also includes a process for forming a prepress proof comprising, in order:

(I) providing a photosensitive element comprising in order, from top to bottom:
  (1) a strippable cover sheet which is transparent to actinic radiation;
  (2) a photosensitive layer, optionally containing a colorant;
  (3) an essentially non-photosensitive, non-tacky organic layer comprising a polymer selected from the group consisting of:
    (a) structured, preferably block, or random polymers prepared from at least one aromatic monomer and at least one monomer selected from the group consisting of butadiene, olefins such as ethylene, propylene, etc., butylene, isobutylene, butene, isoprene, 1,4-hexadiene, acrylonitrile and vinyl acetal; and
    (b) reaction products of random polymers prepared from at least one aromatic monomer and at least one monomer selected from the group consisting of an olefin such as ethylene, propylene, etc., and butylene with 2-butenedioic acid or cyclic anhydrides such as succinic anhydride, maleic anhydride, etc.; and
  (4) a support sheet.
(II) peeling off the support sheet and laminating the essentially non-photosensitive, non-tacky organic layer of the photosensitive element to a permanent support;
(III) imagewise exposing the photosensitive element to actinic radiation through a color separation to form imaged and non-imaged areas; and
(IV) developing the exposed photosensitive element by removing, preferably peeling off, the cover sheet along with the exposed areas of the photosensitive layer to form a right reading, optionally colored right reading image, on the permanent support.

To form an overlay four color proof, steps (I)–(IV) are repeated using a different pigmented photosensitive element and the corresponding color separation and the elements so formed are overlaid in the appropriate order.

The preferred process utilizes a photosensitive element in sheet form (versus roll) and a sheet laminator to produce the multicolor proofs.

EXAMPLES

The following examples illustrate the invention wherein the parts and percentages are by weight.

EXAMPLE 1

Negative Overlay "Cromacheck™" Structure

A 12.0% solids solution of the following rubbers were made in toluene for each film evaluated. Films were cast from solution onto 300A Mylar® using a 3 mil doctor knife. The resulting dry films possessed coating weights between 49 and 58 mg/sq dm.

| FILM | ORGANIC POLYMER | TYPE | COATING WEIGHT (MG/DM$^2$) |
| --- | --- | --- | --- |
| 1 | Kraton ® D-1114 | SIS | 58 |
| 2 | Kraton ® D-1125 | SIS | 55 |
| 3 | Kraton ® G-1652 | SEBS | 49 |
| 4 | Kraton ® G-1650 | SEBS | 50 |

SIS = styrene/isoprene/styrene
SEBS = styrene//ethylene/butylene//styrene

The organic polymer coated films were laminated to a magenta photopolymer (magenta PP) layer coated on 200 ED Mylar® using a Cromalin® laminator. The photopolymer coating weight was 25 mg/sq dm. The resulting structure was Mylar® 200ED/magenta PP/organic polymer/Mylar® 300A.

The photopolymer layer was coated from a 26.4% solids by weight solution using 30/70 w/w methanol/toluene coating solvent. The photopolymer dry ingredients consisted in parts by weight of:

| INGREDIENTS | WEIGHT (g) |
| --- | --- |
| PRO-823, manufactured by Sartomer Company, Exton, PA | 39.09 |
| Fluorad ® FC-430, 3M Co., Minneapolis, MN | 0.10 |
| Elvacite ® 2051, ICI Acrylics, St. Louis, MO | 21.44 |
| Magenta Chips, manufactured by Quaker Color, Quakertown, PA | 22.98 |
| Scarlet Chips manufactured by Quaker Color, Quakertown, PA | 6.74 |
| o-Cl HABI | 3.06 |
| Calcofluor White, manufactured by BASF Corp., Parsippany, NJ | 2.02 |
| Uvitex ® OB, manufactured by Ciba Geigy Corp., Hawthorne, NY | 2.02 |
| 2-mercaptobenzoxazole | 1.76 |
| Polyox ® WSRN-3000, manufactured by Union Carbide Chemicals and Plastics Co., Inc. | 0.77 |
| TOTAL SOLIDS | 100 |

Peel force measurements were conducted by blanket exposing 1 inch (2.54 cm) wide strips of composite film structure through the 200ED Mylar® side. The peel force required to remove the 200ED Mylar® cover sheet was recorded below. The peel force is that required to remove the 200EDMYlar® cover sheet plus the photosensitive layer from the organic layer.

| Organic Polymer | n = | Average Peel Force (g/in) | std deviation (g/in) |
|---|---|---|---|
| Kraton ® D-1114 | 4 | 428 | 17 |
| Kraton ® D-1125 | 4 | 519 | 17 |
| Kraton ® G-1652 | 4 | 21.3 | 1.4 |
| Kraton ® G-1650 | 4 | 14.8 | 2.2 | n = number of samples treated

All films were capable of generating a negative working image on the peeled cover sheet under a UGRA target manufactured, by GATF, Pittsburgh, Pa., in the exposure range of 25–150 counts using a Douthitt exposure unit, manufactured by Douthitt Corp., Detroit, Mich.

EXAMPLE 2

The peel-apart elements of the invention may be used to make a Positive Surprint Peel-Apart Structure as follows.

A 12.0% solids solution of Kraton® G1652 rubber was made in toluene. Another 12.0% solids solution of Kraton® G1650 rubber was made in toluene. Films were cast from solution onto 92 gauge silicone Mylar® using a 3 mil doctor knife. The resulting dry films possessed a coating weight of 80 mg/sq dm. The essentially non-photosensitive, non-tacky organic polymer layer (TPE)/92 silicone Mylar® film structures were laminated at room temperature using 400 mm/min lamination speed and 450 lbs. nip pressure to the magenta photopolymer layer/200ED film structure of Example 1. The resulting composite film structures were 92 silicone Mylar®/TPE/magenta PP/200 ED Mylar®. After removing the 92 silicone Mylar®, the composite structures were hot roll laminated to Cromalin® CR/1 receptor (DuPont) at 110° C. roll temperature using 800 mm/min lamination speed and 275 lbs. nip pressure. The films were imaged at 75 counts under a UGRA target using a Douthitt exposure unit and peeled leaving a positive working surprint image for both films.

EXAMPLE 3

Negative Overlay "Cromacheck™" Structure

A 12.0% solids solution of the following rubbers were made in toluene for each film evaluated. Films were cast from solution onto 300A Mylar® using a 3 mil doctor knife. The resulting dry films, except for Kraton® D-1107 (commercial control), possessed coating weights of approximately 51 ±2 mg/sq dm.

| FILM | ORGANIC POLYMER | TYPE |
|---|---|---|
| 1 | KRATON ® G-1657 | SEBS |
| 2 | KRATON ® G-1726 | SEBS |
| 3 | KRATON ® G-1750 | EP |
| 4 | KRATON ® G-1901 | SEBS-2% succinic anhydride |
| 5 | KRATON ® G-1921 | SEBS-2% succinic anhydride |
| 6 | KRATON ® D-1107 at 105 mg/dm$^2$ | SIS |

EP = ethylene/propylene

The organic polymer coated films were laminated at room temperature to the 25 mg/sq dm magenta photopolymer layer (see Example 1) coated on 200 ED Mylar® using a Cromalin° laminator. The resulting structure was 200ED Mylar®/magenta PP/organic polymer/300A Mylar®.

Peel force measurements were conducted by blanket exposing 1 inch wide strips of composite film structure through the 200ED Mylar® side. The peel force required to remove the 200ED Mylar® cover sheet was recorded:

| ORGANIC POLYMER | n | Avg. Peel Force (g/in) | Std Dev. (g/in) |
|---|---|---|---|
| KRATON ® G-1657 | 4 | 48.0 | 1.6 |
| KRATON ® G-1726 | 4 | 12.7 | 1.2 |
| KRATON ® G-1750 | 4 | 30.1 | 1.0 |
| KRATON ® G-1901 | 4 | 19.5 | 1.1 |
| KRATON ® G-1921 | 4 | 29.5 | 0.5 |
| KRATON ® D-1107 at 105 mg/dm$^2$ | 4 | 258.6 | 3.0 |

All films were capable of generating a negative working image on the peeled cover sheet under a UGRA target in the exposure range of 40–90 counts using a Douthitt exposure unit.

What is claimed is:

1. An improved multilayer peel-apart photosensitive element comprising, in order, from top to bottom:
    (1) a strippable cover sheet which is transparent to actinic radiation;
    (2) a photosensitive layer;
    (3) an essentially non-photosensitive, non-tacky organic layer comprising a polymer selected from:
        (a) structured block or random polymers prepared from at least one aromatic monomer and at least one monomer selected from, ethylene, propylene, butylene, isobutylene, butene, 1,4-hexadiene, and vinyl acetate; and
        (b) reaction products of random polymers prepared from at least one aromatic monomer and at least one monomer selected from ethylene, propylene, and butylene with 2-butenedioic acid or cyclic anhydrides, wherein the organic layer is soluble in toluene; and
    (4) a support sheet.

2. The element of claim 1 wherein a photorelease layer consisting essentially of a solid oxyethylene homopolymer photorelease agent of the formula, $H(COH_2CH_2)_nOH$, with a molecular weight greater than about 3000 is present between the strippable cover sheet and the photosensitive layer.

3. The element of claim 1 wherein the phototsensitive layer contains a colorant.

4. The element of claim 1 wherein the photosensitive layer is a photopolymerizable layer.

5. The element of claim 1 wherein the photosensitive layer has a coating weight of 5 to 50 mg/dm$^2$.

6. The element of claim 1 wherein the strippable cover sheet is selected from the group consisting of polyester, polyamide, polyimide, polystyrene and polyolefin.

7. The element of claim 6 wherein strippable cover sheet is electrically-discharge, flame, plasma or electron-beam treated.

8. The element of claim 1 wherein the at least one aromatic monomer of the structured, block or random polymers is selected from the group consisting of styrene and substituted styrene.

9. The element of claim 1 wherein the coating weight of the essentially non-photosensitive, non-tacky organic layer is about 25 to 200 mg/dm$^2$.

10. The element of claim 1 wherein support is selected from the group consisting of silicone-treated, electrically discharged, corona-treated, electron beam treated and plasma-treated films selected from the group consisting of polyester, matte finished polyester and polyethylene.

11. The element of claim 1 wherein the photosensitive element is in sheet form.

12. An improved multilayer peel-apart photosensitive element comprising, in order, from top to bottom:
   (1) a strippable cover sheet which is transparent to actinic radiation;
   (2) a photosensitive layer;
   (3) an essentially non-photosensitive, non-tacky organic layer comprising a polymer selected from:
      (a) structured block or random polymers prepared from at least one substituted styrene selected from α-methyl styrene, p-hydroxy styrene, and combinations thereof, and at least one monomer selected from butadiene, ethylene, propylene, butylene, isobutylene, butene, isoprene, 1,4-hexadiene, acrylonitrile and vinyl acetate; and
      (b) reaction products of random polymers prepared from at least one aromatic monomer and at least one monomer selected from ethylene, propylene, and butylene with 2-butenedioic acid or cyclic anhydrides; and
   (4) a support sheet.

13. The element of claim 12 wherein the essentially non-photosensitive, non-tacky organic layer is a block or random polymer selected from the group consisting of styrene//ethylene/butylene//styrene block copolymer, styrene//ethylene/propylene block copolymers, hydrogenated butadiene polymers with styrene, hydrogenated isoprene polymers with styrene, styrene//butadiene//ethylene block copolymers, ethylene/1,4-hexadiene/propylene rubber grafted with isobutylene and styrene, ethylene/1,4-hexadiene/propylene rubber grafted with isobutylene, α-methyl styrene, styrene/ethylene/isobutylene random copolymers, styrene//acrylonitrile, styrene//isobutylene, styrene//ethylene, styrene//propylene, polyolefin polymers with styrene grafted thereon, acrylonitrile/ethylene/isobutene/styrene/vinyl acetate, acrylonitrile/ethylene/propylene/styrene/vinyl acetate, acrylonitrile/1-butene/ethylene/propylene/vinyl acetate, acrylonitrile/ethylene/isobutene/styrene and acrylonitrile/ethylene/olefin/styrene.

14. The element of claim 12 wherein the essentially non-photosensitive, non-tacky organic layer is a random polymer selected from the group consisting of styrene/ethylene/butylene copolymers and reaction products thereof with 2-butenedioic acid or cyclic anhydrides.

* * * * *